(12) United States Patent
Verhaegen et al.

(10) Patent No.: US 8,021,989 B2
(45) Date of Patent: Sep. 20, 2011

(54) METHOD FOR HIGH TOPOGRAPHY PATTERNING

(75) Inventors: Staf Verhaegen, Putte (BE); Axel Nackaerts, Haasrode (BE)

(73) Assignee: IMEC, Leuven (BE)

( * ) Notice: Subject to any disclaimer, the term of this patent is extended or adjusted under 35 U.S.C. 154(b) by 793 days.

(21) Appl. No.: 11/441,821

(22) Filed: May 26, 2006

(65) Prior Publication Data
US 2007/0140637 A1 Jun. 21, 2007

(30) Foreign Application Priority Data
May 27, 2005 (EP) ..................................... 05447123

(51) Int. Cl.
*H01L 21/31* (2006.01)
*H01L 21/469* (2006.01)
(52) U.S. Cl. ........ 438/773; 438/300; 438/635; 438/770; 438/966; 257/499; 257/E21.619; 257/E21.634
(58) Field of Classification Search .................. 438/669, 438/942, 300, 610, 635, 770, 773, 966; 257/499, 257/E21.619, E21.634
See application file for complete search history.

(56) References Cited

U.S. PATENT DOCUMENTS

| 5,081,058 | A  | * | 1/1992  | Sasaki ........................... 438/226 |
| 6,645,797 | B1 | * | 11/2003 | Buynoski et al. ............. 438/157 |
| 6,706,571 | B1 |   | 3/2004  | Yu et al. |
| 7,105,390 | B2 | * | 9/2006  | Brask et al. ................... 438/149 |
| 7,456,426 | B2 | * | 11/2008 | Breitwisch et al. ............. 257/50 |
| 2004/0099925 | A1 | * | 5/2004 | Poveda ........................ 257/622 |
| 2005/0189583 | A1 | * | 9/2005 | Kim et al. ..................... 257/327 |

FOREIGN PATENT DOCUMENTS
EP  1 383 166 A2  1/2004

OTHER PUBLICATIONS

Choi et al. "Sub-20nm CMOS FinFET Technologies" 2001, IEEE, IEDM 01 pp. 421-424.*

* cited by examiner

*Primary Examiner* — Alexander G Ghyka
*Assistant Examiner* — Leonard Chang
(74) *Attorney, Agent, or Firm* — Knobbe Martens Olson & Bear LLP

(57) ABSTRACT

One inventive aspect is related to a method for isolating structures of a semiconductor material, comprising providing a pattern of the semiconductor material comprising at least one elevated line, defining device regions in the pattern, the device regions each comprising at least said at least one elevated line, and modifying the conductive properties of the semiconductor material outside said device regions, such that the device regions are electrically isolated.

12 Claims, 2 Drawing Sheets

METHOD FOR HIGH TOPOGRAPHY PATTERNING

BACKGROUND OF THE INVENTION

1. Field of the Invention

Certain inventive aspects relate to a method for isolating structures within a semiconductor device with high topography. They also relate to a multi-gate device obtained via application of the method.

2. Description of the Related Technology

Topography is a crucial part of device processing. This holds even more for Multi-Gate devices, which are regarded as possible alternatives for classical CMOS devices in sub-45 nm technologies. The term 'Multi-Gate device' or 'MuG-FET' refers to a family of devices known in literature as FinFETs, Tri-gate, Omega-gate, Pi-gate, etc. Multi-gate FETs have been proposed as an option for the extremely short FET as due to the gate geometry they have superior short-channel effect immunity and control over bulk devices in the sub-30 nm physical gate length regime.

In a FinFET the gate at least partially envelops the channel region, as opposed to the classic planar device where the gate electrode is formed in one plane on top of the channel region, which is part of the substrate. The FinFET further comprises the source and drain regions adjacent to the channel region.

Important issues in the fabrication of these devices are e.g. the patterning of 25 nm gates over high topography due to the fins. In MUGFETs the active area is patterned from a semiconductor layer as e.g. SOI (Silicon On Insulator) layer of the order of tens of nm thick or a GOI (Germanium On Insulator) layer or SiGe layer, and consists of source and drain connected by fins. Narrow fins are required to have a better short channel effect control: typically the physical width of the fin should be about half of the gate length. The channel width on the other hand is determined by the height of the fin: the higher the fin, the more current can flow from source to drain. Therefore the gate stack is deposited on a surface with an intrinsically high topography.

In order to achieve small active areas, an important issue is how to maintain proper control when the lines patterned on semiconductor material are etched to separate the various FinFETs on the wafer. For controlling the critical dimension it is best to use dense long lines. By critical dimension (CD) it is meant the dimension of the smallest geometrical feature (width of interconnect line, contacts, trenches, etc.) which can be formed during semiconductor device manufacturing using a given technology.

However, a problem with such dense long lines patterned on semiconductor material is that their width is locally difficult to control where an open area in the line is to be provided. Various solutions to the problem have been proposed, such as performing a double patterning in the resist (fin layer). This allows good control of the critical dimension as well as an easier gap control. However, it creates regions with high and low topography. Alternatively, a double patterning in a hard mask or a double patterning with a second etch can be envisaged.

Another difficulty is that the density of the high topography pattern influences the processing of the layers on top of the high topography layer. This renders the CD control on the next layers more difficult, because a CD difference can be seen above regions with different density. One solution used today is to place extra dummy features in the high topography layer in regions where there weren't any present. This solution is limited because these dummy features have to be placed at a sufficiently great distance away from the active devices so as not to influence their electrical behaviour.

Another solution to mitigate the above-mentioned drawback, that can be used in conjunction with the use of dummy features, is to apply a poly etch-back step (gate layer). This is performed on top of the fins. This solution, however, is limited in the planarization capability and still differences may be present in regions with substantial pattern density differences.

As already mentioned one prefers to have narrow fins in order to better control the short channel effect. Moreover, they are advantageous in terms of space utilization. An interesting way to achieve these goals is by applying spacer defined fins. Typically spacer defined fins are obtained by using a sacrificial layer. When this sacrificial layer is etched, two narrow spacers remain. The spacer defined fins are described in detail, e.g., in (EP 1383166, U.S. Pat. No. 6,706, 571-B).

SUMMARY OF CERTAIN INVENTIVE ASPECTS

Certain inventive aspects aim to provide a method for high topography patterning that results in a uniform pattern density which eases the next processing steps and results in relaxed requirements for the active patterning lithography. These inventive aspects also aim to provide a multi-gate device resulting from the application of the method.

One inventive aspect relates to a method for isolating structures of a semiconductor material, comprising:
  providing a pattern of the semiconductor material comprising at least one elevated line,
  defining device regions in the pattern, the device regions each comprising the at least one elevated line, and
  modifying the conductive properties of the semiconductor material outside the device regions, such that the device regions are isolated.

In one inventive aspect, the defining of device regions is performed by covering the device regions with a hard mask. The hard mask preferably is a non-oxidizing material. The hard mask may be formed of nitride.

In one inventive aspect the step of modifying the conductive properties is performed by turning the semiconductor material outside the device regions into dielectric material.

In case the hard mask is a non-oxidizing material, the modifying step comprises a selective oxidation step.

Alternatively said modifying step comprises forming a PN junction between the device regions and the semiconductor material outside the device regions.

In one inventive aspect, the dense high topography pattern is obtained by a lithographic patterning step comprising interferometry.

In another inventive aspect the dense high topography pattern comprises a plurality of parallel lines. In another inventive aspect, the plurality of parallel lines is obtained by patterning a dedicated layer for creating spacer defined fins by etching.

Preferably the semiconductor material is a SoI, a GoI or a SiGe layer. The at least one elevated line can also be a semiconductor nanocarbon tube or a nanowire.

Another aspect relates to a multi-gate device comprising a pattern comprising at least one elevated line of a semiconductor material and device regions defined in the pattern. The device regions each comprise at least said at least one elevated line, whereby the device regions are electrically isolated by isolation regions defined in the semiconductor material of the at least one elevated line.

Another inventive aspect relates to a multi-gate device obtained by performing the steps of the method as previously described, wherein the pattern of semiconductor material comprises a plurality of elevated lines and whereby a device region for the multi-gate device is defined. The plurality of elevated lines defines a pattern of fins wherein the device region for the multi-gate device is provided.

BRIEF DESCRIPTION OF THE DRAWINGS

In FIG. 1A the step of providing a dense high topography pattern (either by conventional lithography, interferometry or spacer defined fin) is shown. In FIG. 1B device regions are defined and in FIG. 1C the conductive properties of the uncovered parts outside the devices regions are altered.

DETAILED DESCRIPTION OF CERTAIN INVENTIVE ASPECTS

Mesa isolation is a known technique, whereby in the circuits formed on semi-insulating substrate adjacent devices are isolated by etching through a conducting layer. "Islands" are thereby formed in which devices are formed. While in these prior art solutions FinFETs are separated by removing semiconductor material, certain embodiments follow a different approach. However, the method is first presented in a much more general context.

One starts from a high topography pattern of semiconductor material comprising at least one elevated line. By elevated line is meant a line having a non-zero aspect ratio (i.e. ratio of height to width), such line being elevated from the semiconductor surface, i.e., raised above the semiconductor surface, as is also shown in FIG. 1. Alternatively one can start from a pattern, wherein the high topography line(s) is a semiconductor nanocarbon tube or a nanowire.

Figure 1A:
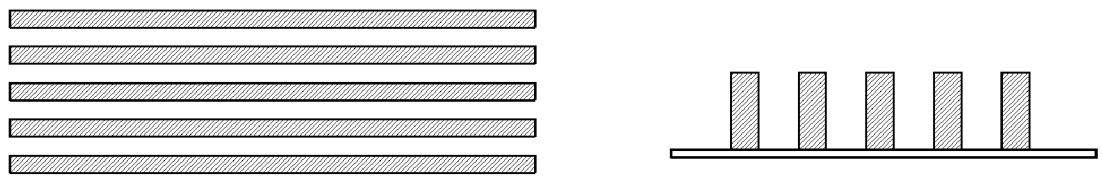
FIGS. 1A, 1B, and 1C represent the steps of the method of one inventive embodiment.
Figure 1B:
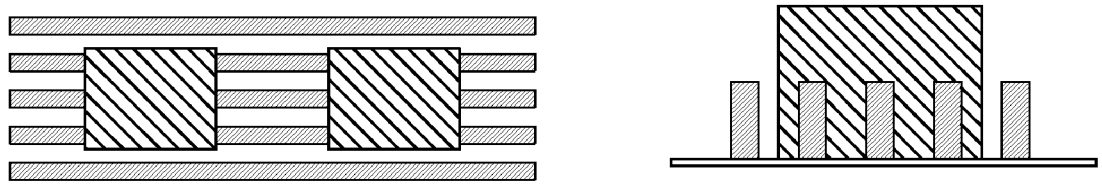

In a first step, a dense high topography line pattern of the semiconductor material with small pitch (i.e., small distance between the centers of two neighboring features) and critical dimension is patterned. The dense pattern may for example be a pattern of parallel lines. Said lines can have a critical dimension of, e.g., 15 nm. This allows performing a lithography step with the highest possible resolution of a state of the art lithography machine or allows the use of interferometric systems where two light rays under a certain angle are used to image grating structures (see for example http://www.amphibianlitho.com as of the filing date). FIG. 1A shows both a top view and a cross-section.

In a second step, device regions are defined (see FIG. 1B) in the pattern. A possible way to achieve this is by covering the device regions with a hard mask. In one embodiment this can be achieved by covering the device regions with a non-oxidating material such as nitride. It is to be noted that by device region is meant a region wherein a complete device (e.g., a FinFET) can be formed, rather than just a part like a drain or a gate.

Figure 1C:
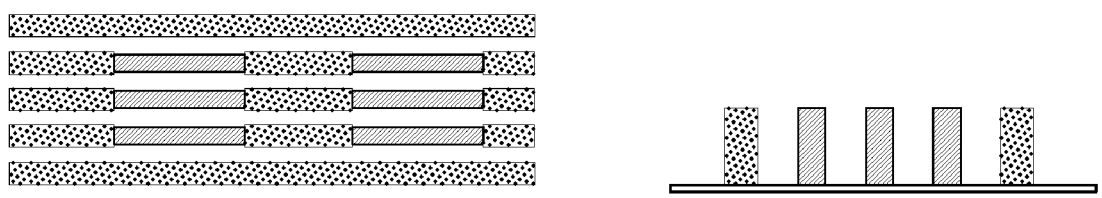

In a third step the electrical, more precisely the conductive, properties of the semiconductor material outside the device regions are altered. In one embodiment the unwanted parts of the dense high topography pattern are converted into a dielectricum (FIG. 1C). In one embodiment, a selective oxidation step is performed. In another embodiment, an implant can be used, that creates a PN junction serving as isolation between the device regions (with one type of dopant) and the semiconductor material outside the device regions having the opposite type of dopant.

Figure 2:
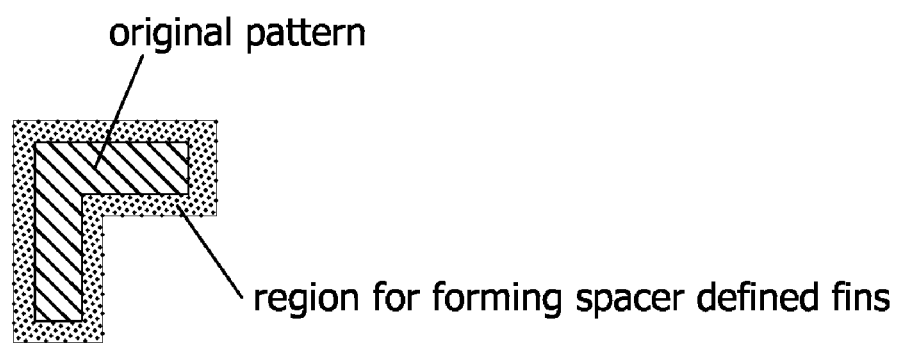
FIG. 2 represents a pattern of spacer defined fin grown around the original (sacrificial) pattern.

The method is well suited for being applied in order to obtain spacer defined fins. In this case the dense high topography pattern of semiconductor material, in which device regions are defined, is obtained by a conventional patterning of dense parallel lines. These parallel lines are obtained in two steps by patterning dense parallel lines in a layer intended for creating spacer-defined lines (known as spacer defined fins). Spacer defined fins are created at all edges of a conventional pattern. After the dedicated layer is grown around the original pattern, the original pattern is removed, so a closed loop pattern is formed that follows the border of the original pattern (see FIG. 2). This way one can obtain a line pattern with half the pitch of the original pattern. Certain embodiments allow the use of each part of the closed loop by dividing the loop into electrically isolated parts.

The method as explained above can be applied to produce devices in a similar way to that of the structured ASIC approach. This approach aims to combine the advantages of an application specific design methodology and the much more cost efficient approach of programming FPGAs (Field Programmable Gate Arrays). A structured ASIC design, therefore, uses less power than the same design implemented in an FPGA. The critical and expensive lower levels of a structured ASIC form a common part, on top of which a specific logic function can be programmed in the upper levels of the fabrication process. The functionality of an integrated circuit is thereby defined in the lithography steps by reused masks combined with circuit specific masks for a few selected layers. The method of one embodiment is very suitable for providing said critical layers. The method is also applicable for FPGAs.

The procedure of the method for isolating structures according to certain embodiments may comprise the following steps:

1. Start with SOI wafers with 60 nm Si;
2. Pattern the fins on SOI (160 nm pitch, 40 nm CD);
3. Deposit a thin pad oxide (15 nm) to reduce stress;
4. Deposit a nitride layer (Si3N4, 80 nm) to protect from oxidation;
5. 6 nm high temperature oxide (HTO) deposition;
6. Active area photo;
7. Dry etch nitride, stop on oxide;
8. Strip resist;
9. 15 nm dry oxidation; and
10. Wet etch nitride.

The method according to one embodiment permits the operation of dummy structures with a uniform density. Another advantage is that the requirements for the active pattern lithography can be relaxed. The lithography step in this method is relatively simple because the lithography conditions can be optimized for one uniform regular pattern, whereas in the prior art especially for small structures this represents a complex processing step. As a further advantage the method increases the mechanical stability of the fins.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. A method of isolating structures of a semiconductor material, the method comprising:
    providing a pattern of the semiconductor material comprising an elevated line;
    defining two device regions in the pattern, the device regions being separated by an isolation region in the pattern located between the device regions wherein each device region comprises a region in which a FinFET is to be formed, wherein the isolation region electrically connects the device regions to each other, wherein the elevated line has a portion in each of the device regions and the isolation region; and
    after providing a pattern of the semiconductor material and defining device regions in the pattern, converting all the semiconductor material of the isolation region connecting the device regions into dielectric material, such that the device regions are electrically isolated from each other.

2. The method according to claim 1, wherein the defining of device regions comprises covering the device regions with a hard mask.

3. The method according to claim 2, wherein the hard mask comprises a non-oxidizing material.

4. The method according to claim 3, wherein the hard mask comprises materials formed of nitride.

5. The method according to claim 1, wherein the converting of the semiconductor material comprises turning the semiconductor material outside the device regions into a dielectric material.

6. The method according to claim 5, wherein the converting of the semiconductor material comprises a selective oxidation step.

7. The method according to claim 1, wherein the modifying of the conductive properties comprises forming a PN junction between the device regions and the semiconductor material outside the device regions.

8. The method according to claim 1, wherein the pattern comprises a dense high topography pattern obtained by lithographic patterning comprising interferometry.

9. The method according to claim 1, wherein the pattern comprises a dense high topography pattern comprising a plurality of parallel lines.

10. The method according to claim 1, wherein the semiconductor material comprises a SoI, GoI or SiGe layer.

11. The method according to claim 1, wherein the elevated line comprises a semiconductor nanocarbon tube or a nanowire.

12. The method according to claim 1, wherein the converting of the semiconductor material comprises modifying the portion of the elevated line in the isolation region.

* * * * *